United States Patent
Uan-Zo-Li et al.

(10) Patent No.: US 9,766,276 B2
(45) Date of Patent: Sep. 19, 2017

(54) POWER ADAPTER DETECTION

(71) Applicant: INTEL CORPORATION, Santa Clara, CA (US)

(72) Inventors: Alexander B. Uan-Zo-Li, Hillsboro, OR (US); Xiaoguo Liang, Shanghai (CN); Rajiv K. Mongia, Fremont, CA (US); Matthew D. Coakley, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 527 days.

(21) Appl. No.: 14/125,462

(22) PCT Filed: Jun. 28, 2013

(86) PCT No.: PCT/CN2013/078324
§ 371 (c)(1),
(2) Date: Dec. 11, 2013

(87) PCT Pub. No.: WO2014/205762
PCT Pub. Date: Dec. 31, 2014

(65) Prior Publication Data
US 2015/0185260 A1    Jul. 2, 2015

(51) Int. Cl.
*H02J 7/00* (2006.01)
*G01R 21/00* (2006.01)
*G06F 1/28* (2006.01)

(52) U.S. Cl.
CPC .............. *G01R 21/00* (2013.01); *G06F 1/28* (2013.01); *H02J 7/0068* (2013.01)

(58) Field of Classification Search
CPC ........ G06F 1/28; G06F 1/3206; G06F 1/3296; G01R 21/00; H02J 7/0052; H02J 7/0068; H02J 9/005; H02M 3/33507; Y02B 60/1285
See application file for complete search history.

(56) References Cited

U.S. PATENT DOCUMENTS

2002/0171398 A1*  11/2002  Odaohhara ............. H02J 9/005
                                                                320/128
2003/0159073 A1    8/2003  Breen et al.
(Continued)

FOREIGN PATENT DOCUMENTS

CN       1801570 A       7/2006
WO       2012036688 A1   3/2012

OTHER PUBLICATIONS

International Search Report and Written Opinion received for PCT Patent Application No. PCT/CN2013/078324, mailed on Mar. 27, 2014, 12 pages.

(Continued)

*Primary Examiner* — Vuthe Siek
(74) *Attorney, Agent, or Firm* — International IP Law Group, P.L.L.C.

(57) ABSTRACT

A method and system are described herein for detecting a capacity for a power adapter. An example of a method includes detecting an increase in power consumption by a computing device attached to the power adapter. The method can also include detecting a droop in voltage received from the power adapter. Additionally, the method can include storing the current that corresponds with the droop.

19 Claims, 5 Drawing Sheets

(56) References Cited

U.S. PATENT DOCUMENTS

| | | | |
|---|---|---|---|
| 2004/0075419 A1* | 4/2004 | Massey | H02J 1/14 320/117 |
| 2006/0082934 A1 | 4/2006 | Price et al. | |
| 2008/0265912 A1* | 10/2008 | Gasperi | G01R 27/04 324/652 |
| 2013/0159792 A1 | 6/2013 | Brooks et al. | |
| 2013/0285460 A1* | 10/2013 | DeHaven | H02M 3/285 307/82 |
| 2014/0095899 A1* | 4/2014 | Sultenfuss | G06F 1/266 713/300 |
| 2014/0355308 A1* | 12/2014 | Uan-Zo-Li | H02M 1/32 363/15 |

OTHER PUBLICATIONS

EP Search Report, EP Application No. 13887990, date of completion Feb. 1, 2017, 2 pages.

* cited by examiner

300

400

POWER ADAPTER DETECTION

BACKGROUND

Field

This disclosure relates generally to detecting a power adapter, and more specifically, but not exclusively, to detecting the capacity of a power adapter.

Description

The power consumption of many mobile devices can vary depending on the commands that are executed in the mobile devices. For example, a mobile device may consume a larger amount of power when executing software applications that result in a processor executing an increased number of instructions. In some examples, a mobile device may also consume a larger amount of power if executing a software application results in the mobile device executing instructions in multiple hardware components. Therefore, many of the power adapters for mobile devices are designed to provide enough power to exceed the power consumption of the most power consuming software applications and hardware components.

BRIEF DESCRIPTION OF THE DRAWINGS

The following detailed description may be better understood by referencing the accompanying drawings, which contain specific examples of numerous features of the disclosed subject matter.

DESCRIPTION OF THE EMBODIMENTS

The size of power adapters may depend on the amount of power that can be provided from the power adapter to a mobile device. For example, a power adapter that can provide a large amount of power to a mobile device may be larger than a power adapter that can provide a smaller amount of power. In some examples, power adapters that provide an amount of power that equals or exceeds the maximum power consumption of a mobile device can be physically larger than power adapters that provide an amount of power equal to the average amount of power consumption of a mobile device. Some techniques may use a third pin in the power adapter which can indicate the capacity of a power adapter. In some examples, the mobile device can use battery power whenever the power consumption of the mobile device exceeds the capacity by the power adapter. However, the third pin can increase the size of the power adapter and the mobile system as well as the cost of the connector.

According to embodiments of the subject matter discussed herein, a mobile device can detect the capacity of a power adapter based on a detected droop in power without a third pin in the power adapter. A droop, as referred to herein, includes any suitable drop in the voltage output by a power adapter. For example, as the power consumption of a mobile device exceeds a threshold, the voltage output by a power adapter may droop. In some examples, the mobile device can detect the capacity of a power adapter based on the droop. A power adapter, as referred to herein, can include any suitable external power supply that can provide power to an electronic device, such as a mobile device, among others.

Reference in the specification to "one embodiment" or "an embodiment" of the disclosed subject matter means that a particular feature, structure, or characteristic described in connection with the embodiment is included in at least one embodiment of the disclosed subject matter. Thus, the phrase "in one embodiment" may appear in various places throughout the specification, but the phrase may not necessarily refer to the same embodiment.

Figure 1:
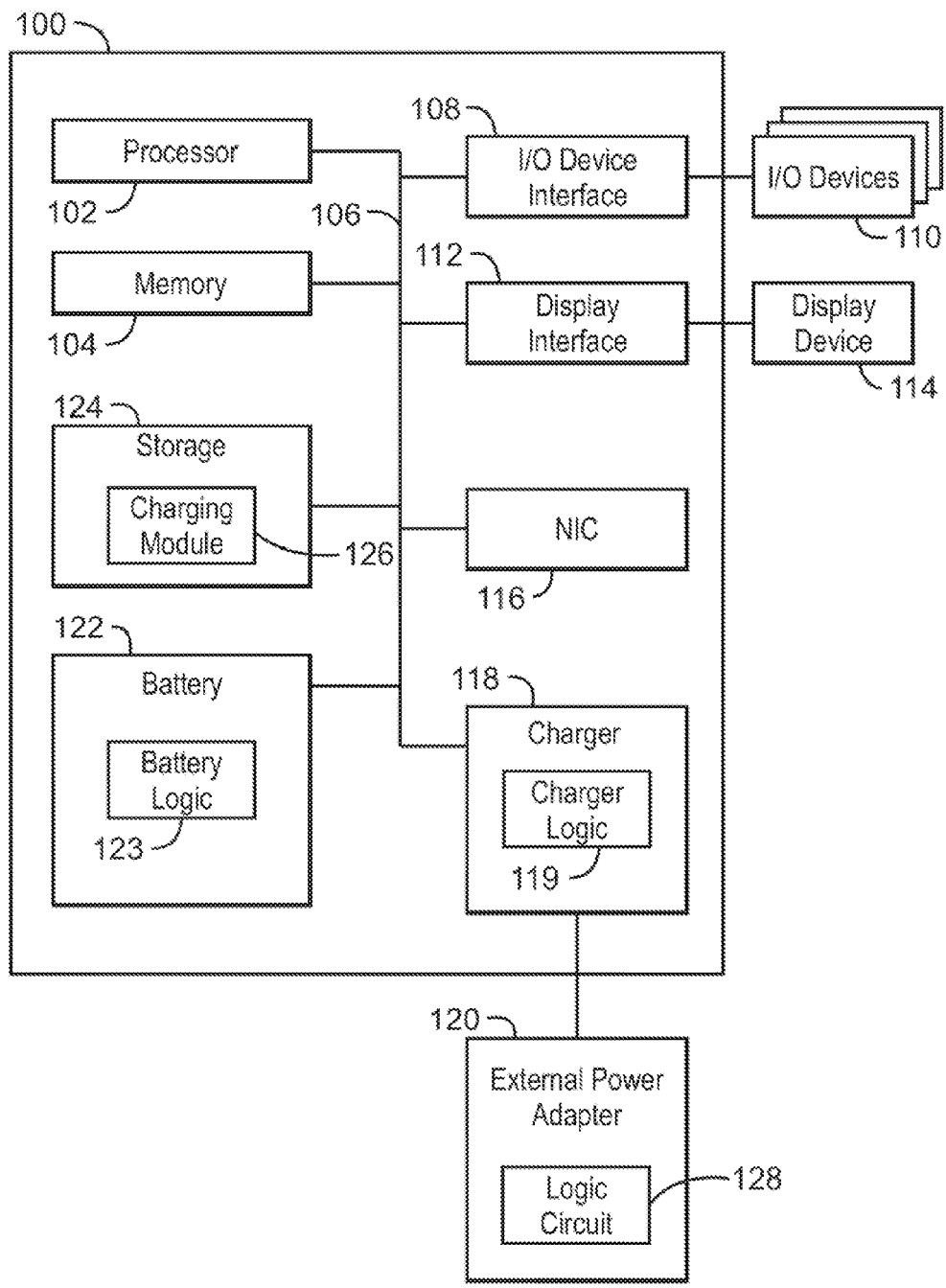
FIG. 1 is a block diagram of an example of a computing system that can detect the capacity of a power adapter.

FIG. 1 is a block diagram of an example of a mobile device that can detect the capacity of a power adapter. The mobile device 100 may be, for example, a mobile phone, laptop computer, desktop computer, or tablet computer, among others. The mobile device 100 may include a processor 102 that is adapted to execute stored instructions, as well as a memory device 104 that stores instructions that are executable by the processor 102. The processor 102 can be a single core processor, a multi-core processor, a computing cluster, or any number of other configurations. The memory device 104 can include random access memory, read only memory, flash memory, or any other suitable memory systems. The instructions that are executed by the processor 102 may be used to implement a method that can detect the capacity of a power adapter.

The processor 102 may be connected through a system interconnect 106 (e.g., PCI®, PCI-Express®, etc.) to an input/output (I/O) device interface 108 adapted to connect the mobile device 100 to one or more I/O devices 110. The I/O devices 110 may include, for example, a keyboard and a pointing device, wherein the pointing device may include a touchpad or a touchscreen, among others. The I/O devices 110 may be built-in components of the mobile device 100, or may be devices that are externally connected to the mobile device 100.

The processor 102 may also be linked through the system interconnect 106 to a display interface 112 adapted to connect the mobile device 100 to a display device 114. The display device 114 may include a display screen that is a built-in component of the mobile device 100. The display device 114 may also include a computer monitor, television, or projector, among others, that is externally connected to the mobile device 100. In addition, a network interface controller (also referred to herein as a NIC) 116 may be adapted to connect the mobile device 100 through the system interconnect 106 to a network (not depicted). The network (not depicted) may be a cellular network, a radio network, a wide area network (WAN), a local area network (LAN), or the Internet, among others.

The processor 102 may also be linked through the system interconnect 106 to a charger 118. The charger 118 may provide power to the mobile device 100 from an external power adapter 120. In some examples, the external power adapter 120 can receive power from any suitable power outlet. The external power adapter 120 can also provide power to a battery 122 in the mobile device 100 through the charger 118. In some examples, the charger 118 can provide power to the mobile device 100 from the external power adapter 120 and the battery 122, or any combinations thereof. In some embodiments, the battery 122 can include battery logic 123 that can include hardware logic, firmware logic, software logic, or any combination thereof. In some examples, the battery logic 123 can detect a notification from charger logic 119 to apply a charge to the battery 122. In some embodiments, the charger 118 can include charger logic 119 that can include hardware logic, firmware logic, software logic, or any combination thereof. In some examples, the charger logic 119 can detect an increase in power consumption by a computing device, such as the mobile device 100, attached to the external power adapter 120. The charger logic 119 can also detect a droop in voltage received from the external power adapter 120 and store the current that corresponds with the droop. The charger logic 119 can also request additional power from battery logic 123 in response to the droop.

The processor 102 may also be linked through the system interconnect 106 to a storage device 124 that can include a hard drive, an optical drive, a USB flash drive, an array of drives, or any combinations thereof. The storage device 124 may include a charging module 126 that can detect the capacity of an external power adapter 120. In some examples, the charging module 126 can receive information related to the voltage output of a power adapter 120 from a charger 118. For example, charger logic 119 may detect a droop in the voltage output or current from the external power adapter 120. In some examples, the droop in the voltage output of the external power adapter 120 may occur in response to the power consumption of the mobile device 100 exceeding the capacity of the external power adapter 120. The mobile device 100 may store the detected capacity of the external power adapter 120 in the storage device 124. In some examples, the mobile device 120 can use power from the battery 122 whenever the power consumption of the mobile device 100 exceeds the capacity of the external power adapter 120.

In some examples, the charging module 126 can generate a notification to increase the power consumption of the mobile device 100 above a threshold. For example, the charging module 126 may generate a notification and transmit the notification to the processor 102. The notification may result in the processor 102 executing an increased number of operations, which can result in increased power consumption by the mobile device 100. In some examples, the charging module 126 can also generate a notification and transmit the notification to the charger logic 119. The notification can indicate that the charger logic 119 is to increase the charge applied to the battery 122, which can result in increased power consumption by the mobile device 100. In some examples, the increased power consumption of a mobile device 100 can cause a droop in voltage from the external power adapter 120 and enable the charging module 126 to detect the capacity of the external power adapter 120.

In some examples, the external power adapter 120 can include a logic circuit 128. The logic circuit 128 can provide a first level of output voltage to the mobile device 100. The logic circuit 128 can also determine a second output voltage for a time period that indicates the capacity of the external power adapter 120. Additionally, the logic circuit 128 can provide the second output voltage for the time period to the charger 118.

It is to be understood that the block diagram of FIG. 1 is not intended to indicate that the mobile device 100 is to include all of the components shown in FIG. 1. Rather, the mobile device 100 can include fewer or additional components not illustrated in FIG. 1 (e.g., additional memory components, embedded controllers, additional modules, additional network interfaces, etc.). Furthermore, any of the functionalities of the charging module 126 may be partially, or entirely, implemented in hardware and/or in the processor 102. For example, the functionality may be implemented with an application specific integrated circuit, in the logic implemented in the charger 118, logic implemented in an embedded controller, or in logic implemented in the processor 102, among others.

Figure 2:
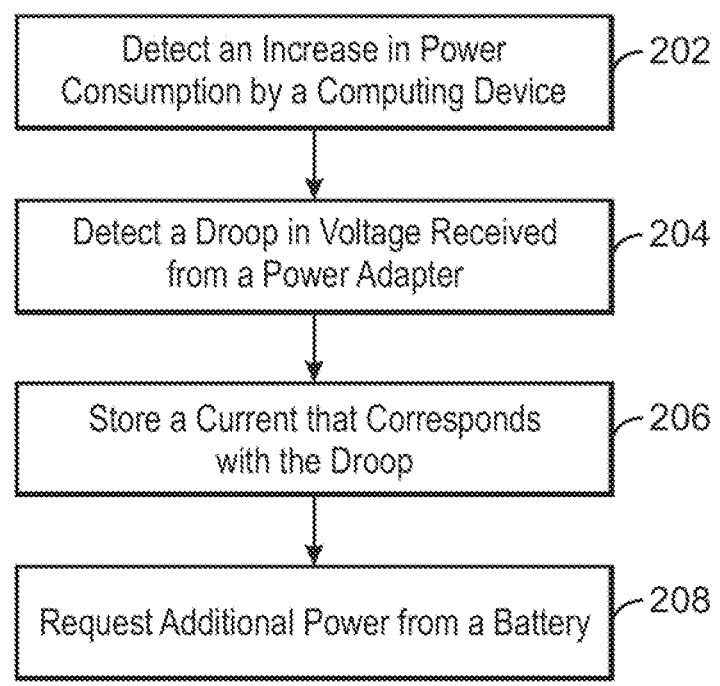
FIG. 2 is a process flow diagram of an example method for detecting the capacity of a power adapter.

FIG. 2 is a process flow diagram of an example method for detecting the capacity of a power adapter. The method 200 can be implemented with any suitable computing device, such as the mobile device 100 of FIG. 1.

At block 202, the charging module 126 can detect an increase in power consumption by a computing device attached to the power adapter. In some examples, the increase in power consumed by a computing device can occur as applications or hardware components execute additional instructions or perform additional tasks. For example, some applications may prompt a processor to increase the number of operations performed over a period of time. Additionally, some hardware components may execute additional instructions in microprocessors, which can increase the amount of power consumed by a computing device. In some examples, the charging module 126 can send a notification to the processor or a charger to increase the power consumed by the computing device. For example, the charging module 126 may request that the processor execute additional operations over a period of time to increase the power consumed by the computing device. Alternatively, the charging module 126 may apply a charge to a battery in a computing device to increase the power consumed by the computing device.

At block 204, the charging module 126 can detect a droop in voltage received from the power adapter. As discussed above, a droop can include any suitable drop in the voltage output provided to a computing device from an external power adapter. In some examples, the droop in voltage from an external power adapter can result from a computing device consuming an amount of power that exceeds the capacity of the external power adapter. For example, the external power adapter may provide an amount of power to a computing device below the capacity of the external power adapter for a period of time. The computing device may increase power consumption above the capacity of the external power adapter, which may result in a droop in voltage received by the computing device from the external power adapter. As discussed above, in some examples, the charging module 126 can increase the power consumption of a computing device above a threshold that corresponds with a capacity of an external power adapter and detect a droop in voltage received from the external power adapter.

At block 206, the charging module 126 may store the current that corresponds with the droop. The current that corresponds with the droop can indicate the capacity of a power adapter. For example, the current that corresponds with a droop may indicate that a power adapter has a smaller capacity than a power adapter that can provide power during maximum power consumption by a computing device. In some examples, the current corresponding to a droop can be stored until a different power adapter is detected.

At block 208, the charging module 126 can request additional power from a battery in response to the droop. In some examples, the charging module 126 can use the current that corresponds with a droop as a threshold value. The threshold value can indicate that a computing device is to request power from a battery when the power consumed by the computing device exceeds the threshold value. In some examples, the computing device may request power from a battery and receive power from an external power adapter simultaneously. In some examples, the computing device may request power from a battery and limit receiving power from an external power adapter if the power consumed by a computing device exceeds the threshold value. The computing device may also request power from a battery and limit receiving power from an external power adapter if the average power consumed by the mobile device exceeds the power adapter capability. In some examples, the average power consumed by a mobile device is determined using a root means square calculation, which can represent the thermally significant continuous power consumption of a mobile device.

The process flow diagram of FIG. 2 is not intended to indicate that the operations of the method 200 are to be executed in any particular order, or that all of the operations of the method 200 are to be included in every case. Additionally, the method 200 can include any suitable number of additional operations. In some examples, the method 200 can include detecting any suitable number of power adapters based on the capacities of the power adapters. In some examples, the method 200 can include detecting a voltage corresponding to a droop in voltage received from the power adapter. The voltage and time slope corresponding to the droop may also be stored to indicate the capacity of the power adapter.

Figure 3:
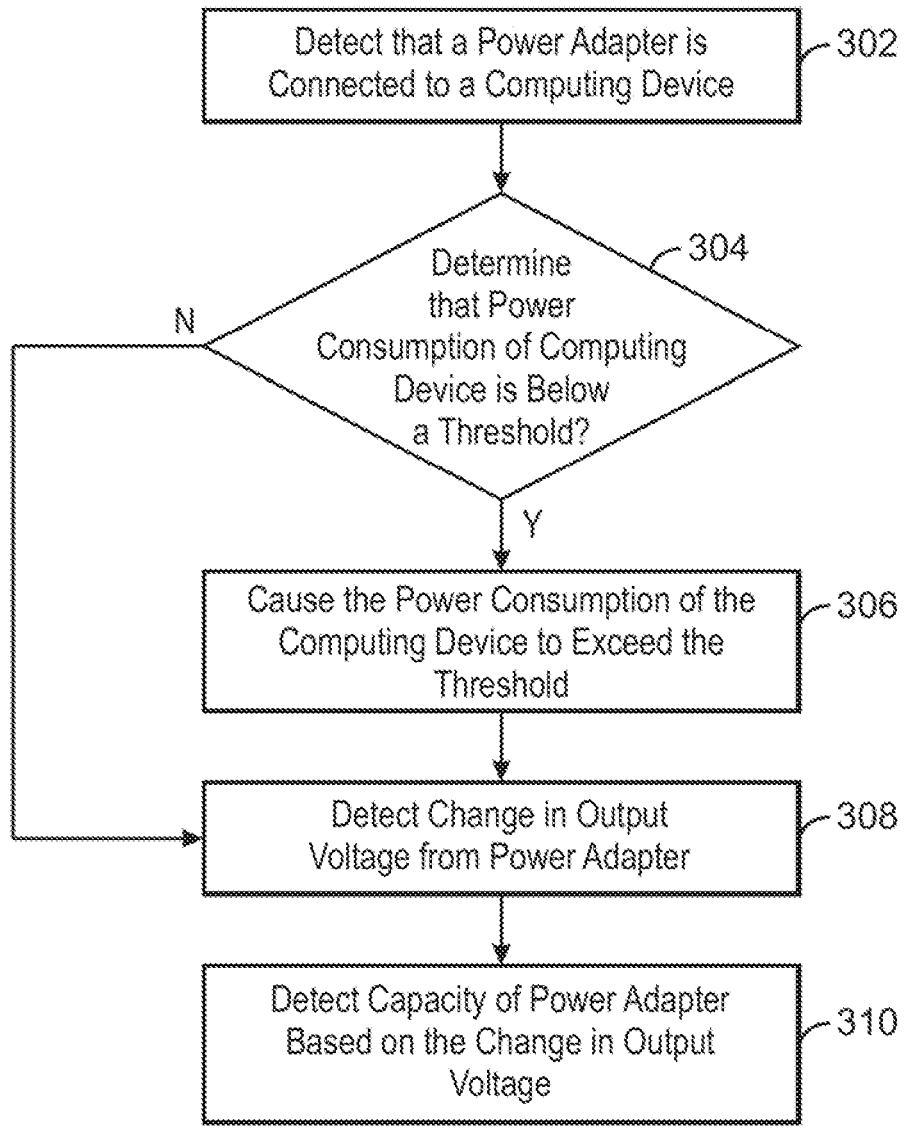
FIG. 3 is a process flow diagram of an example method for detecting the output voltage of a power adapter.

FIG. 3 is a process flow diagram of an example method for detecting the output voltage of a power adapter. The method 300 can be implemented with any suitable computing device, such as the mobile device 100 of FIG. 1.

At block 302, a charging module 126 can detect that a power adapter is connected to the charger of a computing device. In some examples, the charging module 126 can assert any suitable signal or indicator that a power adapter is connected to a charger in a computing device. In some examples, the charging module 126 can detect an initial output voltage from the power adapter, which can trigger the charging module 126 to generate and assert an indicator that a power adapter is connected to a charger.

At block 304, a charging module 126 may also determine that the power consumption of the computing device is below a threshold. For example, the charging module 126 may store a predetermined value as a threshold that corresponds with an amount of power consumed from a power adapter by a computing device. In some examples, the threshold can also correspond with an amount of power consumption that may result in a voltage droop for a power adapter. For example, the threshold may correspond to an amount of power consumption by a mobile device that exceeds the power capability of some power adapters. If the power consumption of the computing device is below a threshold, the process flow continues at block 306. If the power consumption of the computing device is above a threshold, the process flow continues at block 308.

At block 306, a charging module 126 can cause the power consumption of the computing device to exceed the threshold. In some examples, the charging module 126 can increase the power consumption of the charger above a threshold for a period of time. In some examples, power consumption of the charger is increased in response to detecting a current from the power adapter is below a current threshold. The charging module 126 can increase the power consumption of a computing device using any suitable technique. For example, the charging module 126 may send a notification to a processor in the computing device that is to result in the computing device executing additional commands within a period of time. In some examples, the charging module 126 may send a notification to the charger to apply additional power to a battery in the computing device. In some examples, the charging module 126 may send a request to an embedded controller to generate the notification and send the notification to the processor, charger, or any combinations thereof. In some examples, the charging module 126 may send a request to an embedded controller to increase the power consumption of the charger. For example, the embedded controller may generate a notification for a processor to execute additional commands within a period of time. Alternatively, the embedded controller may send a notification to a battery to request a charge. In response to the increase in power consumption of the charger above a threshold, a power adapter may determine that the power adapter is connected to a computing system. In some examples, the charging module 126 can notify a processor to increase a number of operations performed by the processor over a period of time. In some embodiments, the charging module 126 can also notify battery logic that a charge is to be applied to a battery.

At block 308, the charging module 126 can detect a change in the output voltage from the power adapter. For example, the charging module 126 may detect that the voltage output from the power adapter decreases for a period of time. In some examples, the charging module 126 may detect that the voltage output from the power adapter decreases for a period of time followed by any suitable number of increases and decreases in output voltage. In some examples, the change in output voltage from the power adapter is in response to increased power consumption by the charger. For example, the power adapter may detect that the power consumption of the charger has increased above a threshold and interpret the increase in power consumption above the threshold as a signal that the power adapter is connected to a computing system. In some examples, the power adapter may respond by providing a different output voltage. In some examples, the power adapter can provide a series of increasing and decreasing output voltages, which can be interpreted by the charging module 126 to identify the capacity of the power adapter. In some examples, the power adapter can provide the series of increasing and decreasing output voltages when the power adapter is connected to a mobile system. The power adapter can recognize when the power adapter is connected to a mobile device and the charger can decode the sequence of voltage droops generated by the power adapter in order to identify the power capability of the power adapter including the peak power, the duration of the peak power, and average power capability.

At block 310, the charging module 126 can detect a capacity of the power adapter based on the change in the output voltage. For example, a decrease in output voltage by the power adapter can correspond to a capacity of the power adapter. In some examples, any suitable combination of decreases and increases in output voltage by the power adapter can correspond to a capacity of a power adapter. In some examples, the charging module 126 can communicate with an embedded controller or a processor that can determine the capacity of the power adapter based on the detected output voltages.

The process flow diagram of FIG. 3 is not intended to indicate that the operations of the method 300 are to be executed in any particular order, or that all of the operations of the method 300 are to be included in every case. Additionally, the method 300 can include any suitable number of additional operations. In some examples, the charging module 126 can return to block 302 whenever the charging module 126 detects that the output from the power adapter has been interrupted. For example, the charging module 126 may detect that a power adapter is no longer providing power to the computing device. The charging module 126 may also detect an output voltage from a power adapter and the charging module 126 can detect if a different power adapter with a different capacity is providing power to the computing device.

Furthermore, the charging module 126 can also send a notification to a processor to reduce the number of commands executed over a period of time. The notification can reduce the power consumption of the computing device. As the power consumption of the computing device is reduced, the charging module 126 can determine a capacity of the attached power adapter.

Figure 4:
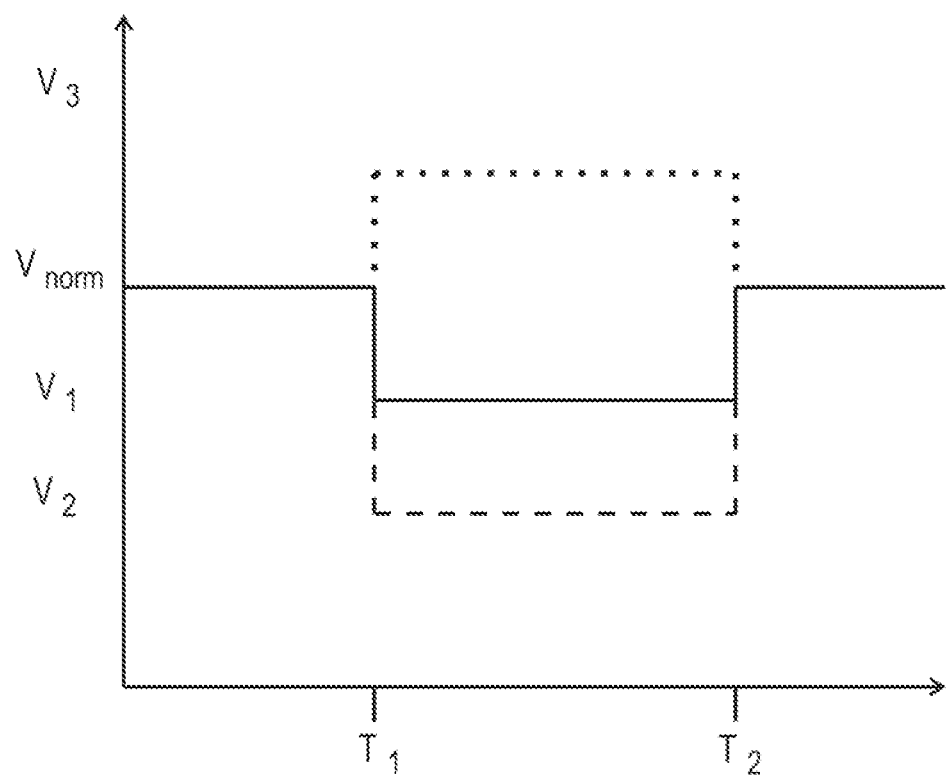
FIG. 4 is an example chart of threshold values that correspond with power adapter capabilities.

FIG. 4 is an example chart of threshold values that correspond with power adapter capabilities. In some examples, the power adapter capabilities are represented as the capacity of a power adapter in watts.

In the example chart, the initial voltages of the power adapter are represented as $V_{norm}$, $V_1$, $V_2$, and $V_3$. In some examples, each power adapter may provide any suitable voltage that is equal to $V_{norm}$. For example, each power adapter may provide the same initial voltage between time 0 and time $T_1$. At time $T_1$, the power adapter may detect an increase in power consumption of an attached computing device above a threshold, which corresponds to the situation when the power adapter is being connected to a mobile device. The power adapter may respond by modifying the voltage for a period of time, $T_d$, which can last from time $T_1$ to time $T_2$. During the time $T_d$, the power adapter may decrease the voltage and increase the voltage to any suitable voltage for any suitable number of times. For example, decreasing the voltage of the power adapter from $V_{norm}$ to $V_1$ may indicate that the capacity of the power adapter is a particular value. In the example chart, decreasing the voltage of the power adapter from $V_{norm}$ (i.e. 19 volts) to $V_1$ (i.e. 18 volts) can indicate that the capacity of the power adapter is 90 watts. Similarly, decreasing the voltage of the power adapter from $V_{norm}$ (i.e. 19 volts) to $V_2$ (i.e. 17 volts) can indicate that the capacity of the power adapter is 75 watts. The decrease in voltage is depicted by a dashed line. Additionally, the power adapter can increase the voltage for the time period $T_d$ to indicate that the capacity of the power adapter is greater than the value corresponding to $V_{norm}$. For example, the power adapter can increase the voltage for the time period $T_d$ from $V_{norm}$ (i.e. 19 volts) to $V_3$ (i.e. 20 volts) which can indicate that the capacity of the power adapter is 120 watts. The increase in voltage is depicted by a dotted line. At time $T_2$, the power adapter can return to providing the voltage that corresponds with $V_{norm}$.

In some examples, the threshold for power consumption associated with $T_1$ can be an amount of power from the power adapter that indicates a power adapter is providing power to the computing device. In some examples, the difference between $V_{norm}$ and $V_1$, $V_2$, or $V_3$, can be in a range that maintains safe operation of a computing device. Additionally, the time Td can be longer than the minimum response time for a computing device to detect a difference in voltage values in the power adapter.

The example chart of FIG. 4 is for illustrative purposes only. The power adapter can use any suitable voltage for the voltage values $V_{norm}$, $V_1$, $V_2$, and $V_3$. Furthermore, the power adapter may decrease or increase the voltage any suitable number of times during $T_d$ to indicate the capacity of the power adapter attached to a computing device. In some examples, the time $T_d$ corresponding to each voltage value could be different. For example, the power adapter may provide a set of alternating higher and lower output voltages for a second period of time.

Figure 5:
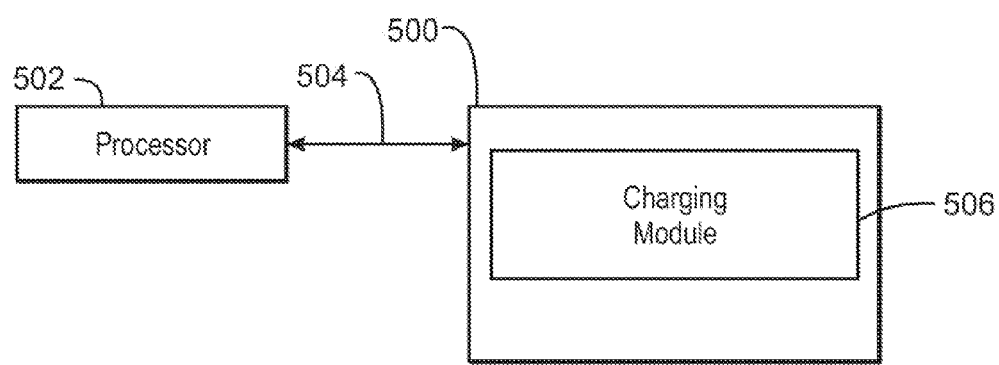
FIG. 5 is a block diagram depicting an example of a tangible, non-transitory computer-readable medium that can detect the capacity of a power adapter.

FIG. 5 is a block diagram of an example of a tangible, non-transitory computer-readable medium that can detect the capacity of a power adapter. The tangible, non-transitory, computer-readable medium 500 may be accessed by a processor 502 over a computer interconnect 504. Furthermore, the tangible, non-transitory, computer-readable medium 500 may include code to direct the processor 502 to perform the operations of the current method.

The various software components discussed herein may be stored on the tangible, non-transitory, computer-readable medium 500, as indicated in FIG. 5. For example, a charging module 506 may be adapted to direct the processor 502 to detect the capacity of a power adapter based on the current from the power adapter. For example, the charging module 506 may detect a decrease or increase in the voltage from the power adapter for a period of time, which can indicate the capacity or maximum output power of the power adapter. In some examples, the charging module 506 can detect the capacity of the power adapter by increasing power consumption of a computing device above a threshold and detecting a droop in voltage. The threshold can indicate an amount of power consumption that exceeds the capacity of the power adapter. In some examples, the charging module 506 can indicate that the computing device is to request power from a battery in addition to the power adapter when the power consumption for the computing device exceeds the threshold. In some examples, the charging module 506 can also determine the capacity of a power adapter by detecting different output voltages from the power adapter, including the pre-determined sequence when the adapter is attached to the mobile platform by the user.

It is to be understood that any number of additional software components not shown in FIG. 5 may be included within the tangible, non-transitory, computer-readable medium 500, depending on the specific application. Furthermore, any number of the modules within the charging module 506 can detect the capacity of a power adapter.

Example 1

In some embodiments, a method for determining a capacity of a power adapter can include detecting an increase in power consumption by a computing device attached to the power adapter. The method can also include detecting a droop in voltage received from the power adapter. Furthermore, the method can include storing a current that corresponds with the droop.

In some embodiments, the method can also include notifying a processor to increase a number of operations performed by the processor over a period of time. In some embodiments, the method can also include notifying a battery logic that a charge is to be applied to a battery. The method can also include generating a notification and sending the notification to increase power consumption by the computing device to a processor, wherein the notification increases a number of operations performed by the processor over a period of time. In some embodiments, the method can also include sending the notification to increase power consumption to a battery, wherein the notification indicates a charge is to be applied to the battery.

Example 2

In some embodiments, a system for determining a capacity of a power adapter can include a battery to receive a current from the power adapter. The system can also include a charger logic to detect an increase in power consumption by a computing device attached to the power adapter. The charger logic can also detect a droop in voltage received from the power adapter. Additionally, the charger logic can store the current that corresponds with the droop. Furthermore, the charger logic can request additional power from a battery in response to the droop.

In some embodiments, the charger logic can also detect a voltage associated with the droop of the power adapter. The charger logic may also store the voltage that corresponds to the droop. Additionally, in some embodiments, the increase in power consumption of the system may result from an application or a hardware component increasing the power consumption of the computing device without an instruction from a charger logic.

In some embodiments, the charger logic may also record (or detect) the values of power (or current) consumed by the mobile device from the power adapter when the power adapter's internal over-current protection circuit turns off the power adapter output. In some examples, these values can be used to identify the power adapter's power capability, and the charger logic may use these values (or a pre-recorded value) to identify the allowed level of power output of the adapter. In some examples, the charger logic may supplement the power adapter's output power with power from the battery when this level of output power is exceeded.

Example 3

In some embodiments, a non-transitory, computer-readable medium comprising a plurality of instructions that, in response to being executed on a mobile device, cause the mobile device to determine a capacity of a power adapter. The plurality of instructions can cause the mobile device to detect an increase in power consumption by a computing device attached to the power adapter. The plurality of instructions can also detect a droop in voltage of the power adapter. Additionally, the plurality of instructions can cause the mobile device to store the current that corresponds with the droop and request additional power from a battery logic in response to the droop.

In some embodiments, the plurality of instructions can cause a mobile device to detect a voltage associated with the droop in power received from the power adapter. The plurality of instructions can also cause the mobile device to store the voltage that corresponds to the droop.

Example 4

In some embodiments, a method for determining a capacity of a power adapter can include detecting that the power adapter is connected to a computing device. The method can also include detecting that the power consumption of the computing device is below a threshold. In addition, the method can include causing the power consumption of the computing device to exceed the threshold. Furthermore, the method can include detecting a change in the output voltage from the power adapter. Additionally, the method can include determining a capacity of the power adapter based on the change in the output voltage.

In some embodiments, the method can include notifying a processor to increase a number of operations performed by the processor over a period of time. The method can also include notifying a battery logic that a charge is to be applied to a battery. In some embodiments, the method can include generating a notification to increase the power consumption by the computing device. In some examples, the method can also include sending the notification to a processor, wherein the notification increases a number of operations performed by the processor in a period of time. Alternatively, the method can include sending the notification to a battery, wherein the notification indicates a charge is to be applied to the battery.

Example 5

In some embodiments, a power adapter can indicate a capacity of the power adapter. The power adapter can include a logic circuit that can provide a output voltage. The logic circuit can also determine a second output voltage of the power adapter, wherein the second output voltage of the power adapter indicates the capacity of the power adapter. Furthermore, the logic circuit can provide the second output voltage for the time period to the charger in response to detecting that the power adapter is connected to a computing system.

In some embodiments, the logic circuit can provide a set of alternating higher output voltages and lower output voltages for a second period of time. In some embodiments, the difference between the first level of output voltage and the second output voltage can be a range that maintains safe operation of a computing device. Additionally, the time period can be longer than the minimum response time for a computing device to detect a difference in voltage values in the power adapter. In some examples, the logic circuit can detect that the power adapter is connected to the computing system by determining that the output power is above a threshold value.

Although an example embodiment of the disclosed subject matter is described with reference to block and flow diagrams in FIGS. 1-5, persons of ordinary skill in the art will readily appreciate that many other methods of implementing the disclosed subject matter may alternatively be used. For example, the order of execution of the blocks in flow diagrams may be changed, and/or some of the blocks in block/flow diagrams described may be changed, eliminated, or combined.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter may be practiced without the specific details. In other instances, well-known features, components, or modules were omitted, simplified, combined, or split in order not to obscure the disclosed subject matter.

Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

Program code may represent hardware using a hardware description language or another functional description language which essentially provides a model of how designed hardware is expected to perform. Program code may be assembly or machine language or hardware-definition languages, or data that may be compiled and/or interpreted.

Furthermore, it is common in the art to speak of software, in one form or another as taking an action or causing a result. Such expressions are merely a shorthand way of stating execution of program code by a processing system which causes a processor to perform an action or produce a result.

Program code may be stored in, for example, volatile and/or non-volatile memory, such as storage devices and/or an associated machine readable or machine accessible medium including solid-state memory, hard-drives, floppy-disks, optical storage, tapes, flash memory, memory sticks, digital video disks, digital versatile discs (DVDs), etc., as well as more exotic mediums such as machine-accessible biological state preserving storage. A machine readable medium may include any tangible mechanism for storing, transmitting, or receiving information in a form readable by a machine, such as antennas, optical fibers, communication interfaces, etc. Program code may be transmitted in the form of packets, serial data, parallel data, etc., and may be used in a compressed or encrypted format.

Program code may be implemented in programs executing on programmable machines such as mobile or stationary computers, personal digital assistants, set top boxes, cellular telephones and pagers, and other electronic devices, each including a processor, volatile and/or non-volatile memory readable by the processor, at least one input device and/or one or more output devices. Program code may be applied to the data entered using the input device to perform the described embodiments and to generate output information. The output information may be applied to one or more output devices. One of ordinary skill in the art may appreciate that embodiments of the disclosed subject matter can be practiced with various computer system configurations, including multiprocessor or multiple-core processor systems, minicomputers, mainframe computers, as well as pervasive or miniature computers or processors that may be embedded into virtually any device. Embodiments of the disclosed subject matter can also be practiced in distributed computing environments where tasks may be performed by remote processing devices that are linked through a communications network.

Although operations may be described as a sequential process, some of the operations may in fact be performed in parallel, concurrently, and/or in a distributed environment, and with program code stored locally and/or remotely for access by single or multi-processor machines. In addition, in some embodiments the order of operations may be rearranged without departing from the spirit of the disclosed subject matter. Program code may be used by or in conjunction with embedded controllers.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A method for determining a capacity of a power adapter comprising:
   detecting an increase in power consumption by a computing device attached to the power adapter;
   detecting a droop in voltage received from the power adapter, wherein the droop occurs in response to the power consumption; and
   storing a current that corresponds with the droop in voltage.

2. The method of claim 1, comprising notifying a processor to increase a number of operations performed by the processor over a period of time.

3. The method of claim 1, comprising notifying a battery logic that a charge is applied to a battery.

4. The method of claim 1, comprising:
   detecting a voltage associated with the droop of the power adapter; and
   storing the voltage that corresponds to the droop.

5. The method of claim 1, wherein the increase in power consumption results from an application or a hardware component increasing the power consumption of the computing device without a notification.

6. The method of claim 1, wherein the computing device receives power from a battery and the power adapter.

7. A system for determining a capacity of a power adapter comprising:
   a battery to receive a current from the power adapter; and
   a charger logic to:
   detect an increase in power consumption by a computing device attached to the power adapter;
   detect a droop in voltage received from the power adapter, wherein the droop occurs in response to the power consumption;
   store the current that corresponds with the droop in voltage; and
   request additional power from a battery logic in response to the droop in voltage.

8. The system of claim 7, wherein the charger logic notifies a processor to increase a number of operations performed by the processor over a period of time.

9. The system of claim 7, wherein the charger logic notifies a battery logic that a charge is to be applied to the battery.

10. The system of claim 7, wherein the charger logic:
    detects a voltage associated with the droop of the power adapter; and
    store the voltage that corresponds to the droop.

11. The system of claim 7, wherein the increase in power consumption results from an application or a hardware component increasing the power consumption of the computing device without a notification from the charger logic.

12. The system of claim 7, wherein the computing device receives power from the battery and the power adapter.

13. A non-transitory, computer-readable medium comprising a plurality of instructions that, in response to being executed on a mobile device, cause the mobile device to:
    detect an increase in power consumption by a computing device attached to a power adapter;
    detect a droop in voltage of the power adapter, wherein the droop occurs in response to the power consumption;
    store a current that corresponds with the droop in voltage; and
    request additional power from a battery logic in response to the droop.

14. The non-transitory, computer-readable medium of claim 13, wherein the instructions, in response to being executed on the mobile device, cause the mobile device to notify a processor to increase a number of operations executed by the processor over a period of time.

15. The non-transitory, computer-readable medium of claim 13, wherein the instructions, in response to being executed on the mobile device, cause the mobile device to notify a battery logic that a charge is to be applied to a battery, wherein the battery logic applies the charge to the battery.

16. The non-transitory, computer-readable medium of claim 13, wherein the instructions, in response to being executed on the mobile device, cause the mobile device to:
- detect a voltage associated with the droop from the power adapter; and
- store the voltage that corresponds to the droop.

17. A method for determining a capacity of a power adapter comprising:
- detecting that the power adapter is connected to a computing device;
- detecting that a power consumption of the computing device is below a threshold;
- causing the power consumption of the computing device to exceed the threshold;
- detecting a change in an output voltage from the power adapter when the threshold is exceeded, wherein the change in the output voltage occurs in response to the power consumption; and
- determining a capacity of the power adapter based on the change in the output voltage via a power adapter capability that corresponds with the threshold.

18. The method of claim 17, comprising notifying a processor to increase a number of operations executed by the processor over a period of time.

19. The method of claim 17, comprising notifying a battery logic that a charge is applied to a battery.

* * * * *